US006225653B1

(12) United States Patent
Igel et al.

(10) Patent No.: US 6,225,653 B1
(45) Date of Patent: May 1, 2001

(54) SEMICONDUCTOR COMPONENTS AND METHODS OF MANUFACTURING SEMICONDUCTOR COMPONENTS

(75) Inventors: Günter Igel, Teningen; Joachim Krumrey, München, both of (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/443,565

(22) Filed: Nov. 19, 1999

(30) Foreign Application Priority Data

Nov. 21, 1998 (DE) .............................................. 198 53 743

(51) Int. Cl.$^7$ ...................................................... H01L 29/80
(52) U.S. Cl. ............................ 257/280; 257/284; 257/282; 257/283
(58) Field of Search ...................................... 257/280, 284, 257/282, 283, 476; 357/13, 14, 15; 361/54, 58, 61, 88, 91

(56) References Cited

U.S. PATENT DOCUMENTS

| 4,110,775 | * | 8/1978 | Festa ........................................ 357/15 |
| 4,484,206 | * | 11/1984 | Moroshima et al. ................... 357/13 |
| 4,720,734 | * | 1/1988 | Amemiya et al. ...................... 357/15 |
| 4,860,151 | * | 8/1989 | Hutcheon et al. ..................... 361/91 |
| 4,888,623 | * | 12/1989 | Enomoto et al. ...................... 357/15 |
| 4,890,143 | * | 12/1989 | Baliga et al. ............................ 357/23 |
| 4,982,245 | * | 1/1991 | Hanaoka et al. ....................... 357/15 |
| 5,338,964 | * | 8/1994 | Bernier .................................. 257/476 |
| 5,578,844 | * | 11/1996 | Marukawa et al. .................. 257/280 |

FOREIGN PATENT DOCUMENTS

| 57085266 | 5/1982 | (EP) . |
| 0 090 738 A2 | 10/1983 | (EP) . |
| 0 849 807 A1 | 6/1998 | (EP) . |
| 62-165978 | 7/1987 | (JP) . |
| 08107222 | 4/1996 | (JP) . |
| 8-107222 | * | 8/1996 | (JP) ........................................ 29/866 |

* cited by examiner

Primary Examiner—Charles Bowers
Assistant Examiner—Laura M Schillinger
(74) Attorney, Agent, or Firm—Akin, Gump, Strauss, Hauer & Feld, L.L.P.

(57) ABSTRACT

A semiconductor component (1$a$) has a highly-doped substrate (4) of a first type of doping into which a highly-doped layer (15) of a second type of doping is introduced in some areas to form a pn Zener junction (16), and a low-doped area (17) of the second type of doping extends from this highly-doped layer (15) in the substrate (4) into an epitaxial layer (5) as far as the substrate (4) of the epitaxial layer (5). A Schottky metal (11) at least partially covering the low-doped, diffused area (17) is applied to the side of the epitaxial layer (5) facing away from the substrate (4) to form a Schottky junction (18) between this area (17) and the Schottky metal (11) and another Schottky junction (13) between the Schottky metal and the epitaxial layer (5). Due to the series connection of the oppositely polarized Zener diode and Schottky diode, a low temperature coefficient is achieved. In addition, a low forward voltage is achieved due to the Schottky diode which is polarized in the forward direction of the Zener diode and is connected in parallel to the series connection of a Zener diode and the first Schottky diode.

5 Claims, 4 Drawing Sheets

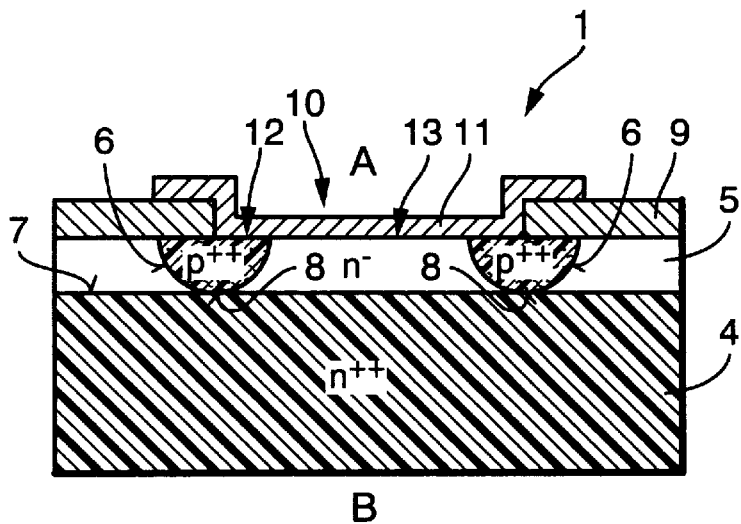
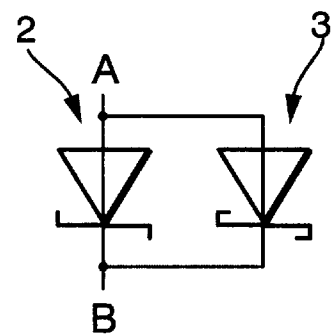
Fig. 1                Fig. 2
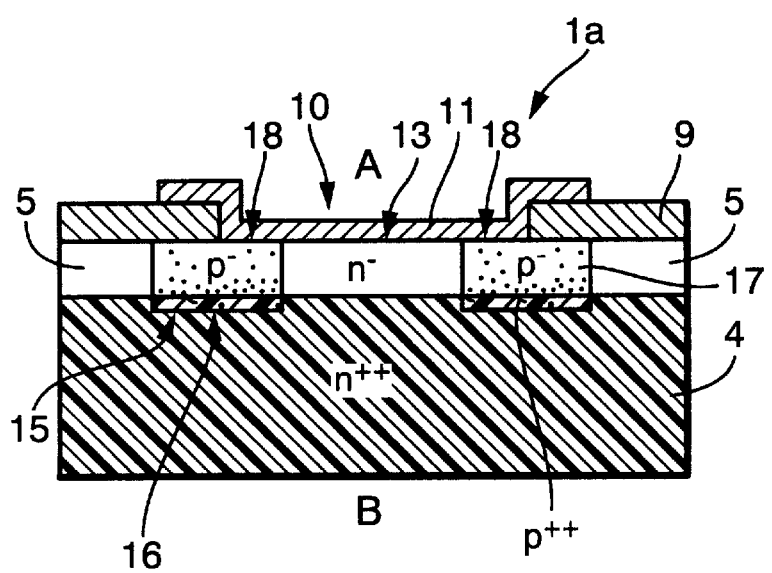
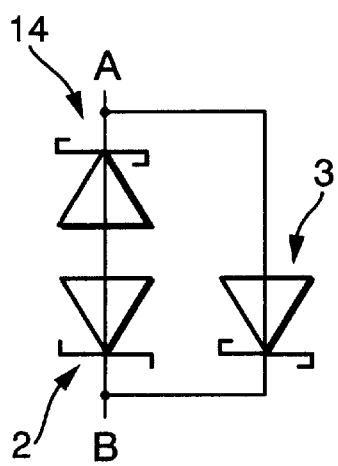
Fig. 3                Fig. 4

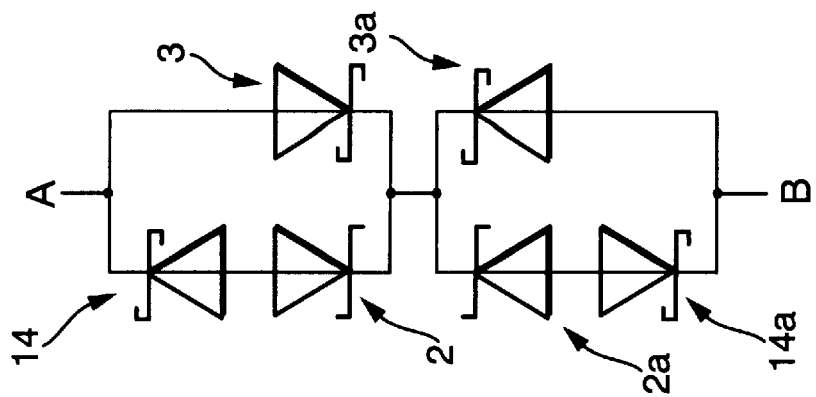
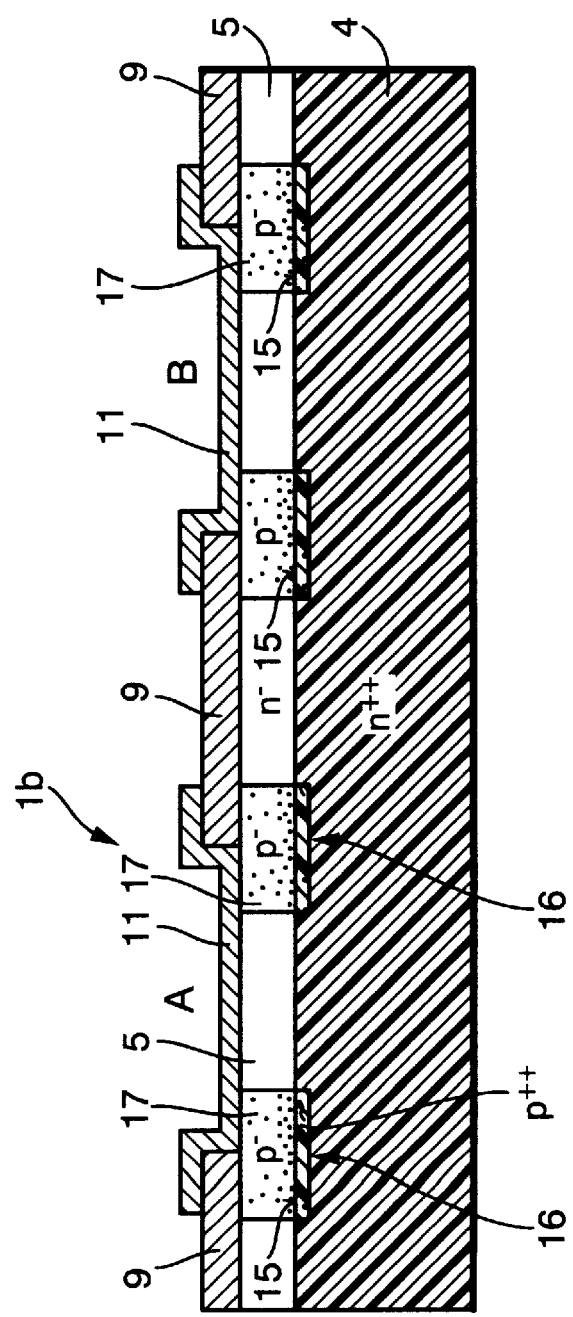
Fig. 5
Fig. 6

SEMICONDUCTOR COMPONENTS AND METHODS OF MANUFACTURING SEMICONDUCTOR COMPONENTS

BACKGROUND OF THE INVENTION

This invention relates to semiconductor components with at least one highly-doped diode, in particular with a Zener diode or a tunnel diode and at least one Schottky diode connected to it in parallel, having a low-doped epitaxial layer of the same type of doping on a highly-doped substrate of the first type of doping, with a zone of a second type of doping being diffused into the epitaxial layer and with a Schottky junction being formed between the epitaxial layer and a Schottky metal on the side of the epitaxial layer facing away from the substrate. In addition, this invention relates to methods of manufacturing such semiconductor components.

Zener diodes of the usual design have a high power loss because of the comparatively high voltage drop in the direction of flow. With so-called double Zener diodes implemented in the form of antiparallel pn junctions, the forward voltage of the other diode is added to the Zener voltage of the one diode. The forward voltage is subject to greater process fluctuations because of the bulk resistance, so that corresponding manufacturing tolerances also occur accordingly.

Japanese published patent application (kokai) JP 8-107 222 A describes a semiconductor component with a Zener diode, having a low-doped epitaxial layer of the same type of doping (N−) on a highly-doped substrate of a first type of doping (N+), with a zone of a second type of doping (P) being diffused into the epitaxial layer, and with a Schottky junction being formed between the epitaxial layer and a Schottky metal on the side of the epitaxial layer facing the substrate.

The layer structure of this semiconductor component is comparatively complicated, and accordingly, many diffusion processes and lithography steps are required, making manufacture of such components expensive. Thus, two metallizations are required for the Schottky junction and the Zener junction. In addition, guard rings around the Schottky junction must be produced in separate steps. Due to the position of the Zener junction within the epitaxial layer and the outer terminal contacting the substrate, the diode current flows through the epitaxial layer, which is a comparatively poor conductor, so there is an increased differential Zener resistance.

Japanese published patent application (kokai) JP 62-165 978 A describes a semiconductor component having a diffused area on a substrate with a Schottky junction there. Opposite types of conduction and double-diffused areas are arranged on the periphery of the Schottky electrode, and an ohmic electrode is provided in the outer area. A Zener diode is formed by the double-diffused areas. This design yields, on the one hand, a Schottky diode having a very short switching time and, on the other hand, a Zener diode connected in parallel, its Zener voltage being of a size such that the Schottky diode, which is sensitive to overvoltage in the reverse direction, is protected from voltage peaks.

The Zener junction formed by the double-diffused areas extends approximately at a right angle to the top side of the arrangement. Therefore, the diffusion concentration decreases uniformly for both areas from the surface toward the inside. Due to this concentration gradient, only a very narrow area near the surface is effective for the Zener junction, so that the Zener diode has only a very low current carrying capacity. Due to the asymmetrical layer arrangement, two photo-lithography steps are required, thus increasing the cost. In addition, two terminals are arranged side by side, resulting in a poor utilization of space by the semiconductor arrangement.

SUMMARY OF THE INVENTION

An object of the present invention is to create a semiconductor component with a Zener diode having improved electrical properties and, in particular, a low forward voltage and a reduced temperature coefficient, if necessary. In addition, a manufacturing method for such semiconductor components should be feasible at a low cost.

To achieve this object, it is proposed first with regard to the device that the zone of the second type of doping should be a highly-doped zone extending all the way to the substrate in the area of the interface between the substrate and the epitaxial layer to form a pn Zener junction, and the Schottky metal should cover the diffused zone at least partially.

By the Schottky junction, a Schottky diode is connected in parallel to the Zener diode and receives the current flow in the forward direction of the Zener diode. There is only a low voltage drop at the Schottky diode and, accordingly, also a low power loss. With this semiconductor component especially good electrical properties are achieved despite the very simple design. This is also true, in particular, of the current carrying capacity and the volume resistance, because on the one hand, the Zener junction can be adapted to the required current carrying capacity with no problem, and because furthermore, there are no layers to increase resistance in the current path. This also contributes to a low power loss.

A first method of producing such a semiconductor component provides for a low-doped epitaxial layer of the same type of doping to be applied to a highly-doped substrate of a first type of doping; then a highly-doped zone of a second type of doping is diffused into the epitaxial layer and extends as far as the substrate layer to form a pn Zener junction in the vicinity of the interface between the substrate and the epitaxial layer; and a Schottky metal at least partially covering the area of the diffused zone is applied to the side of the epitaxial layer facing away from the substrate to form a Schottky junction between the epitaxial layer and the Schottky metal.

This method can be carried out with a few lithography steps and diffusion processes. In particular, only a single metallization is necessary, and at the same time a guard ring for the Schottky junction is formed on diffusion of the highly-doped zone into the epitaxial layer to form the pn Zener junction, so that no separate process step is required for this. Thus, on the whole, the manufacturing cost can be reduced by approximately one-half in comparison with previous methods of producing such semiconductor components.

According to a second embodiment, which is independently worthy of protection, it is provided that a low-doped epitaxial layer of the same type of doping is applied to a highly-doped substrate of a first type of doping; then a highly-doped layer of a second type of doping is introduced into some areas of the highly-doped substrate of the first type of doping to form a pn Zener junction; a low-doped diffused area of the second type of doping extends from this highly-doped layer in the substrate into the epitaxial layer, as far as the surface of the epitaxial layer; and the Schottky metal at least partially covers the low-doped diffused area, forming another Schottky junction between this area and the Schottky metal and the Schottky junction between the Schottky metal and the epitaxial layer.

In this embodiment, a Zener diode with a low temperature coefficient is formed by the series connection of oppositely polarized Zener diode and Schottky diode, if the Zener diode has a positive temperature coefficient, which is the case at approximately 5.6 volt. In addition, a low forward voltage is achieved through the Schottky diode, which is connected in parallel to the series connection of the Zener diode and the first Schottky diode and is polarized in the forward direction of the Zener diode.

According to a refinement of the invention, there is also the possibility of the layer structures according to either of the above embodiments being applied side by side to a common substrate.

Combination with the features of the first embodiment above yields arrangements connected in antiparallel, with the two antiparallel-connected branches each having a Zener diode and a Schottky diode connected in parallel.

Combination with the features of the second embodiment above yields antiparallel-connected arrangements with a Zener diode and a Schottky diode connected in opposite directions in a series connection and with another Schottky diode connected in parallel with this series connection and polarized the same as the Zener diode.

Thus, in addition to a lower temperature coefficient in a certain Zener voltage range, a protective function with respect to overvoltage is obtained with both arrangements with antiparallel-connected diode groups. Due to the antiparallel arrangement, overvoltages of different polarities are also dissipated.

Additional features characterizing the method of producing the semiconductor components according to this invention are described below.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings:

FIG. 1 is a cross-section through a diode arrangement with a Schottky diode connected in parallel with a Zener diode;

FIG. 2 is a circuit diagram of a diode connection like that in FIG. 1;

FIG. 3 is a cross-section through a diode arrangement with a Schottky diode connected in antiparallel to the Zener diode and with a Schottky diode arranged in parallel to this series connection;

FIG. 4 is a circuit diagram of a diode connection like that in FIG. 3;

FIG. 5 is a cross-section through two diode arrangements according to FIG. 3 arranged side by side;

FIG. 6 is a circuit diagram like the embodiment according to FIG. 5;

DETAILED DESCRIPTION OF THE INVENTION

Figure 7:
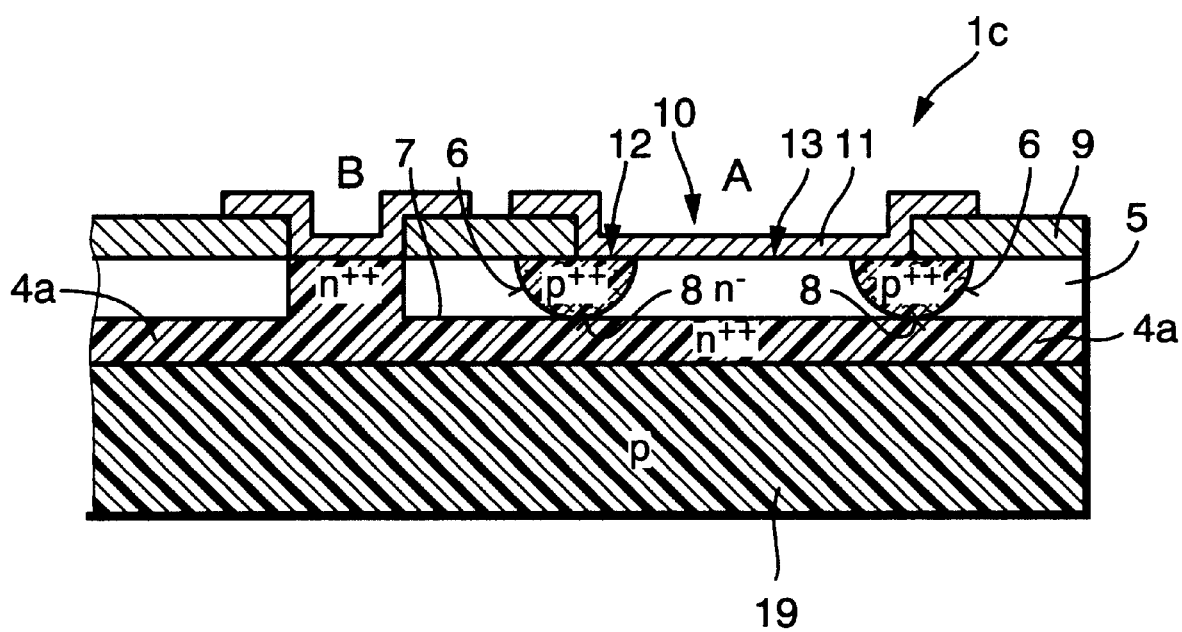
FIG. 7 is a cross-section through a diode arrangement corresponding approximately to FIG. 1, but here with an additional carrier layer and with outer terminals arranged side by side.

In the Figures the outer terminals of the respective semiconductor components 1, 1a through 1d are labeled as A and B. A semiconductor component 1 shown in FIG. 1 forms a parallel circuit of a Zener diode 2 and a Schottky diode 3, as shown in FIG. 2 on the basis of the equivalent circuit. The component shown in FIG. 1 has a highly-doped substrate 4 of a first type of doping to which is applied a low-doped epitaxial layer 5 of the same type of doping. A highly-doped ring-shaped zone 6 of a second type of doping is diffused into epitaxial layer 5, with this diffusion zone 6 extending at least to the interface 7 between the substrate 4 and the epitaxial layer 5. Therefore, a Zener pn junction 8 and thus Zener diode 2 according to FIG. 2 are formed between the two highly-doped areas of different types of doping. An insulation layer 9 with a window opening 10 is provided on the epitaxial layer 5. This window opening 10 is covered by a Schottky metal layer 11, which in turn at least partially contacts the ring-shaped diffusion zone 6. An ohmic junction 12 is formed between the highly-doped zone 6 and the Schottky metal layer 11.

In addition to Schottky metal layer 11 contacting ring-shaped zone 6, it also contacts the portion of the epitaxial layer 5 within the ring-shaped zone, and a flat Schottky junction 13 and thus the Schottky diode 3 are formed between these two layers according to FIG. 2. Due to the parallel circuit of the Schottky diode 3 with the Zener diode 2, a Zener diode with a low forward voltage is formed in practical terms, so that a reduced power loss, essentially one-half the power loss compared to simple Zener diodes, accordingly occurs in the forward direction.

In the circuit shown in FIG. 4, in addition to the arrangement according to FIG. 2, a Schottky diode 14 is connected in antiparallel in series with the Zener diode 2. With the help of this circuit arrangement, a lower temperature coefficient is achieved in a certain Zener voltage range, in addition to the reduced forward voltage, which has advantageous effects above a Zener voltage of approximately 5 volt in particular.

FIG. 3 shows a cross-sectional diagram of the construction of a semiconductor component 1a according to the diode circuit arrangement shown in FIG. 4. To produce such a semiconductor component 1a, a highly-doped layer 15 of the second type of doping is applied in some areas, in particular in a ring shape, to a highly-doped substrate 4 of a first type of doping to form a Zener pn junction 16. While applying a low-doped epitaxial layer 5 of the first type of doping, a low-doped area 17 is produced, extending to the surface of the epitaxial layer 5, by autodoping from the highly-doped layer 15 of the second type of doping.

In this embodiment, epitaxial layer 5 is also covered in some areas by an insulator layer 9 with a window opening 10, and the window opening 10 is covered by a Schottky metal layer 11. The low-doped area 17 of the second type of doping is in contact with the Schottky metal layer 11 and forms a Schottky junction 18 corresponding to Schottky diode 14 in FIG. 4.

The Schottky diode 3 (FIG. 4) is connected in parallel to the series connection of antiparallel-connected Zener diode 2 and Schottky diode 14 (FIG. 4) corresponding to Zener pn junction 16 and Schottky junction 18. In FIG. 3, the Schottky junction 13 is between the Schottky metal layer 11 and the epitaxial layer 5 within the ring-shaped area 17.

The arrangement according to FIG. 1 as well as that according to FIG. 3 can be produced repeatedly in succession on one substrate. Two arrangements according to FIG.

1 side by side would yield two diode groups, each with a parallel circuit consisting of a Zener diode 2 and a Schottky diode 3. The two arrangements would be connected in antiparallel to one another, where the connecting point between the two groups would correspond to substrate 4.

FIG. 5 shows an embodiment where the arrangement shown in FIG. 3 is provided twice side by side. The respective circuit is shown in FIG. 6. With several arrangements according to FIG. 1 or FIG. 3 side by side, the individual groups of diodes—Zener diode 2 and Schottky diode 3 or Zener diode 2 and the two Schottky diodes 3 and 14—would be used as separate semiconductor systems within a circuit, where it must be recalled that there is accordingly an electric connection between the individual systems due to the common substrate. With the direct arrangement of the systems side by side, they have practically no manufacturing tolerances, and thus have largely the same parameters and equally good electrical properties.

If two systems are used as illustrated in FIG. 6, with only the outer terminals A and B being used, this forms a Zener diode arrangement, which has a lower temperature coefficient in a certain Zener voltage range due to the Schottky diodes 14, 14*a* connected in series with the Zener diodes 2, 2*a*, while on the other hand, an overvoltage protective function is provided with this arrangement, due to the Schottky diodes 3, 3*a*, regardless of the polarity of the applied voltage at outer terminals A and B.

If the arrangement according to FIG. 1 is provided twice side by side, the individual systems can be used separately within a circuit, as already mentioned, while on the other hand, however, a protective function would be obtained for the Zener diode system due to an antiparallel connection of two groups, each consisting of Zener diode 2 and Schottky diode 3, because overvoltages of different polarities would be dissipated.

Figure 8:
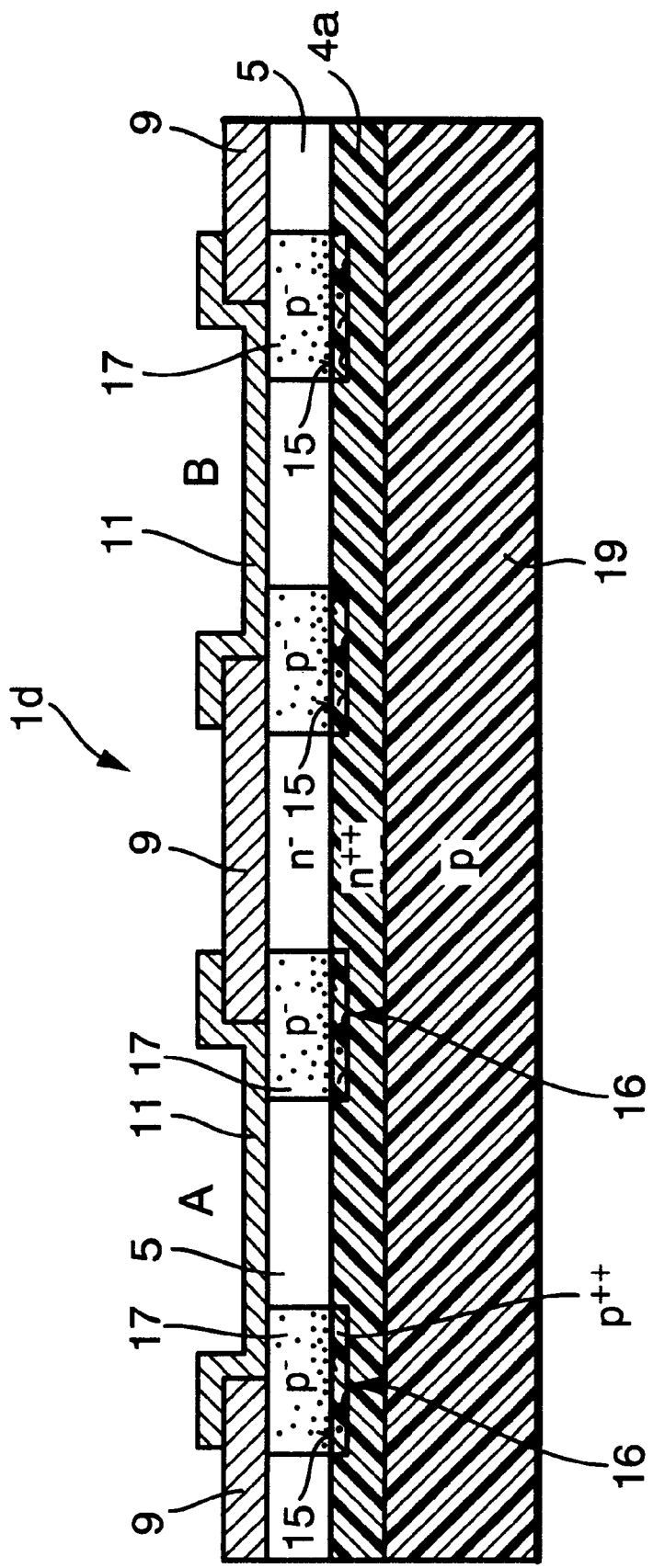
FIG. 8 is a cross-section through a diode arrangement corresponding approximately to FIG. 5, but with an additional carrier layer here.

FIGS. 7 and 8 show semiconductor components corresponding to the circuits according to FIGS. 2 and 6. In deviation from the circuits in FIGS. 1 and 5, a carrier layer 19 of P-doped semiconductor material is provided on the highly-doped substrate 4, facing away from epitaxial layer 5.

The substrate layer 4*a* is comparatively thin in this case, because with this arrangement carrier layer 19 assumes the function of mechanical stabilization. This arrangement is also advantageous due to the better possibility of integration into integrated circuits, because essentially P-type carrier layers are used with them. The outer terminals A and B are arranged on the side of component 1*c*, 1*d* facing away from carrier layer 19.

Since the effective range for current flow in the highly-doped (N++) substrate layer 4*a* is comparatively narrow, it may be constructed to be correspondingly thin and may have a thickness of approximately one micrometer, for example, while the layer thickness of carrier layer 19, which provides mechanical stabilization, may be 100 micrometers or more.

Due to the very thin substrate layer 4*a*, there is also the possibility of doping it to such a great extent that a tunnel diode effect occurs with pn junctions 8, 16, which would otherwise form Zener diodes, and thus one or more tunnel diodes may be formed. Semiconductor components with tunnel diodes can be used in high-frequency technology.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A semiconductor component with at least one Zener diode and at least one Schottky diode in parallel to it, comprising:
    a low-doped epitaxial layer (5) of a first type of doping on a highly-doped substrate (4) of the same type of doping,
    a zone (6) of a second type of doping diffused into the epitaxial layer (5), and
    a Schottky junction (13) formed between the epitaxial layer (5) and a Schottky metal (11) on a side of the epitaxal layer (5) facing away from the substrate (4), wherein
    a highly-doped layer (15) of a second type of doping is introduced into some areas of the highly-doped substrate (4) of the first type of doping to form a pn Zener junction (16),
    a low-doped diffused area (17) of the second type of doping extends from the highly-doped layer (15) in the substrate (4) into the epitaxial layer (5) as far as a substrate of the epitaxial layer (5), and
    the Schottky metal (11) at least partially covers the low-doped, diffused area (17) to form another Schottky junction (18) between the area (17) and the Schottky metal (11) and the Schottky junction (13) between the Schottky metal (11) and the epitaxial layer (5).

2. The semiconductor component according to claim 1, wherein two of the components are arranged next to one another on a common substrate (4).

3. The semiconductor component according to claim 1, wherein a carrier layer (19) of P-doped semiconductor material is provided on the highly-doped substrate (4*a*) facing away from the epitaxial layer (5), and outer terminals (A, B) are arranged on a side of the component facing away from the carrier layer (19).

4. The semiconductor component according to claim 3, wherein the highly-doped substrate (4*a*) has a thickness on an order of approximately one micrometer, and the carrier layer (19) has a thickness on an order of at least approximately 100 micrometers.

5. The semiconductor component according to claim 3, wherein doping of the substrate (4*a*) is dimensioned for a tunnel diode effect between the substrate layer (4*a*) and an adjacent, highly-doped layer of another type of doping.

* * * * *